(12) United States Patent
Ito

(10) Patent No.: US 10,050,205 B2
(45) Date of Patent: Aug. 14, 2018

(54) POLYMER, ORGANIC LIGHT-EMITTING DEVICE MATERIAL INCLUDING THE SAME, AND ORGANIC LIGHT-EMITTING DEVICE INCLUDING THE ORGANIC LIGHT-EMITTING DEVICE MATERIAL

(71) Applicant: SAMSUNG ELECTRONICS CO., LTD., Suwon-si, Gyeonggi-do (KR)

(72) Inventor: Mitsunori Ito, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/391,959

(22) Filed: Dec. 28, 2016

(65) Prior Publication Data

US 2017/0186950 A1    Jun. 29, 2017

(30) Foreign Application Priority Data

Dec. 28, 2015 (JP) .................................. 2015-257208
Nov. 4, 2016 (KR) ........................ 10-2016-0146910

(51) Int. Cl.
*H01L 51/50* (2006.01)
*H01L 51/00* (2006.01)
*C08F 26/06* (2006.01)

(52) U.S. Cl.
CPC ............ *H01L 51/004* (2013.01); *C08F 26/06* (2013.01); *H01L 51/0043* (2013.01); *H01L 51/5016* (2013.01); *H01L 51/5056* (2013.01)

(58) Field of Classification Search
None
See application file for complete search history.

(56) References Cited

U.S. PATENT DOCUMENTS

| 7,160,634 B2 | 1/2007 | Shirota et al. |
| 8,440,325 B2 | 5/2013 | McKiernan et al. |
| 8,945,726 B2 | 2/2015 | Tanaka et al. |
| 2003/0065171 A1* | 4/2003 | Sato ................ C07D 223/14 540/587 |
| 2008/0154005 A1 | 6/2008 | Suzuki et al. |

(Continued)

FOREIGN PATENT DOCUMENTS

| JP | 1995-090255 A | 4/1995 |
| JP | 1996-054833 A | 2/1996 |

(Continued)

*Primary Examiner* — Gregory D Clark
(74) *Attorney, Agent, or Firm* — Cantor Colburn LLP

(57) ABSTRACT

A polymer comprising a first repeating unit represented by Formula 1:

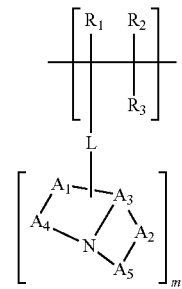

Formula 1 wherein, in Formula 1, groups and variables are the same as described in the specification.

20 Claims, 1 Drawing Sheet

(56) References Cited

U.S. PATENT DOCUMENTS

| | | |
|---|---|---|
| 2012/0319052 A1 | 12/2012 | Brocke et al. |
| 2014/0008624 A1* | 1/2014 | Niina ..................... C08F 12/26 257/40 |
| 2014/0058099 A1 | 2/2014 | Wakamiya et al. |
| 2015/0280131 A1 | 10/2015 | Yomogita et al. |
| 2015/0333273 A1 | 11/2015 | Lee et al. |

FOREIGN PATENT DOCUMENTS

| | | |
|---|---|---|
| JP | 1996-269133 A | 10/1996 |
| JP | 2001-098023 A | 4/2001 |
| JP | 2002-110359 A | 4/2002 |
| JP | 2008-218983 A | 9/2003 |
| JP | 2003-313240 A | 11/2003 |
| JP | 2004-059743 A | 2/2004 |
| JP | 2006-237592 A | 9/2006 |
| JP | 2008-198989 A | 8/2008 |
| JP | 5372519 B2 | 9/2013 |
| JP | 5591996 B2 | 8/2014 |
| WO | 2011-105204 A1 | 9/2011 |
| WO | 2011-107186 A2 | 9/2011 |
| WO | 2014-057852 A1 | 4/2014 |

\* cited by examiner

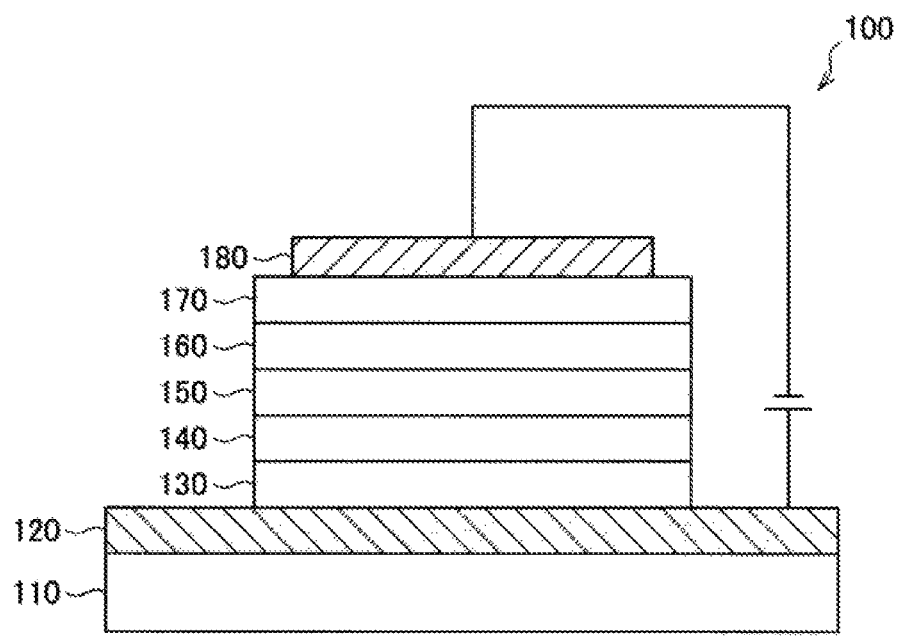

POLYMER, ORGANIC LIGHT-EMITTING DEVICE MATERIAL INCLUDING THE SAME, AND ORGANIC LIGHT-EMITTING DEVICE INCLUDING THE ORGANIC LIGHT-EMITTING DEVICE MATERIAL

CROSS-REFERENCE TO RELATED APPLICATION

This application claims priority to Japanese Patent Application No. 2015-257208, filed on Dec. 28, 2015, in the Japan Patent Office, and Korean Patent Application No. 10-2016-0146910, filed on Nov. 4, 2016, in the Korean Intellectual Property Office, and all the benefits accruing therefrom under 35 U.S.C. § 119, the contents of which are incorporated herein in their entirety by reference.

BACKGROUND

1. Field

The present disclosure relates to a polymer, an organic light-emitting device material including the polymer, and an organic light-emitting device including the organic light-emitting device material.

2. Description of the Related Art

Recently, there has been active development of materials for organic light-emitting devices known as a self-light emitting device, and display devices and lighting fixtures using organic light-emitting devices.

Manufacture of a larger-area organic light-emitting device at a reduced cost, using a solution coating method instead of vacuum deposition has been considered. The solution coating method may have a higher material utilization efficiency and may ensure easy formation of a large-area film without a need for a high-cost vacuum deposition process, as compared with the vacuum deposition method. Accordingly, the solution coating method is expected to be a more efficient method of manufacturing organic light-emitting devices.

SUMMARY

Provided are a polymer having a novel structure that may improve emission efficiency and emission lifespan of an organic light-emitting device, an organic light-emitting device material including the polymer, and an organic light-emitting device using the organic light-emitting device material.

Additional aspects will be set forth in part in the description which follows and, in part, will be apparent from the description, or may be learned by practice of the presented embodiments.

According to an aspect of an embodiment, a polymer includes a first repeating unit represented by Formula 1:

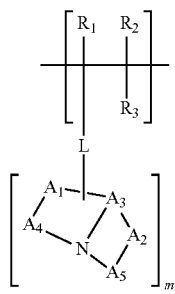

Formula 1 wherein, in Formula 1, $R_1$, $R_2$ and $R_3$ each independently are selected from a hydrogen, deuterium, a fluorine, a C1-C10 alkyl silyl group, a C6-C30 aryl silyl group, a substituted or unsubstituted C1-C10 alkyl group, a substituted or unsubstituted C6-C30 aryl group, and a substituted or unsubstituted C1-C30 heteroaryl group, L is selected from a single bond, a substituted or unsubstituted C1-C10 alkylene group, a substituted or unsubstituted C5-C30 cycloalkylene group, a substituted or unsubstituted C6-C30 arylene group, and a substituted or unsubstituted C1-C30 heteroarylene group, excluding a substituted or unsubstituted carbazolylene group, $A_1$ and $A_2$ each independently are selected from a single bond, an oxygen atom, a sulfur atom, a substituted or unsubstituted C1-C10 alkylene group, a substituted or unsubstituted C6-C30 arylene group, and a substituted or unsubstituted C1-C30 heteroarylene group, $A_3$ is selected from a substituted or unsubstituted trivalent C1-C10 alkyl group, a substituted or unsubstituted trivalent C6-C30 aryl group, and a substituted or unsubstituted trivalent C1-C30 heteroaryl group, $A_4$ and $A_5$ each independently are selected from a substituted or unsubstituted C1-C10 alkylene group, a substituted or unsubstituted C6-C30 arylene group, and a substituted or unsubstituted C1-C30 heteroarylene group, and m is an integer from 1 to 10. The polymer may improve emission efficiency and emission lifespan of an organic light-emitting device.

In some embodiments, the first repeating unit represented by Formula 1 may be a repeating unit represented by Formula 2:

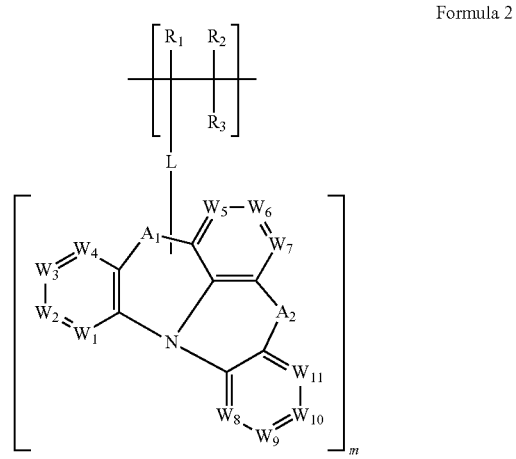

Formula 2 wherein, in Formula 2, $R_1$, $R_2$, $R_3$, L, $A_1$, $A_2$ and m may be defined the same as those described above, $W_1$ to $W_{11}$ may each independently be N or CX, wherein X may be selected from a hydrogen, deuterium, a C1-C10 alkyl silyl group, a C6-C30 aryl silyl group, a C1-C10 alkyl amino group, a C6-C60 aryl amino group, a substituted or unsubstituted C1-C10 alkyl group, a substituted or unsubstituted C6-C30 aryl group, and a substituted or unsubstituted C1-C30 heteroaryl group. The polymer may improve emission efficiency and emission lifespan of an organic light-emitting device.

In some embodiments, L may be selected from a single bond, a substituted or unsubstituted C6-C15 arylene group, and a substituted or unsubstituted C5-C15 heteroarylene group, excluding a substituted or unsubstituted carbazolylene group.

In some embodiments, $A_1$ and $A_2$ may each independently be selected from a single bond, an oxygen atom, and a sulfur atom.

In some embodiments, $W_1$ to $W_{11}$ may each independently be CX.

In some embodiments, X may be selected from a hydrogen, a substituted or unsubstituted C1-C10 alkyl group, a substituted or unsubstituted C6-C30 aryl amino group, and a substituted or unsubstituted C6-C15 aryl group. The polymer may improve emission efficiency and emission lifespan of an organic light-emitting device.

In some embodiments, the polymer may further include a cross-linking group.

In some embodiments, the cross-linking group may be selected from structures represented by the following formulae:

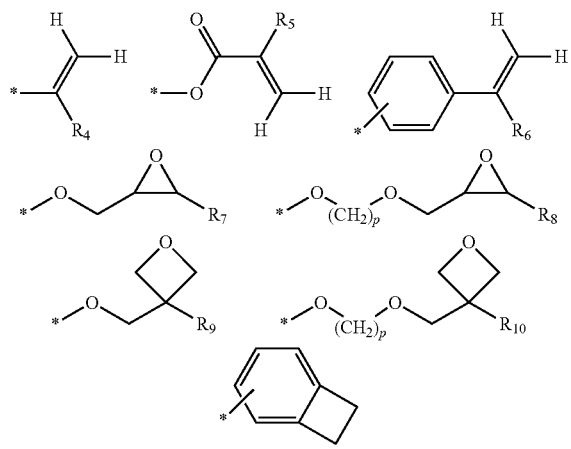

wherein, in the formulae, $R_4$ to $R_{10}$ may each independently be a hydrogen, or a substituted or unsubstituted C1-C10 alkyl group, and p may be an integer from 1 to 10. The polymer may improve emission efficiency and emission lifespan of an organic light-emitting device.

According to an aspect of another embodiment, an organic light-emitting device material includes a polymer according to any of the above-described embodiments, and a solvent.

According to an aspect of another embodiment, an organic light-emitting device includes:

a first electrode;

a second electrode; and an organic layer disposed between the first electrode and the second electrode, wherein the organic layer includes a polymer according to any of the above-described embodiments.

BRIEF DESCRIPTION OF THE DRAWINGS

These and/or other aspects will become apparent and more readily appreciated from the following description of the embodiments, taken in conjunction with the accompanying drawings in which:

FIG. 1 is a schematic view of an organic light-emitting device according to an embodiment.

DETAILED DESCRIPTION

Reference will now be made in detail to embodiments of a polymer, an organic light-emitting device material including the polymer, and an organic light-emitting device including the organic light-emitting device material, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

As materials for organic light-emitting devices (hereinafter, also referred to as organic light-emitting device materials) that are compatible with a solution coating method, for example, low-molecular weight materials and high-molecular weight materials are currently being considered. Among these materials, high-molecular weight materials have a high coating uniformity and may easily form stacked layers, and thus, are under active development. In particular, such high-molecular weight materials are applicable to displays or lighting fixtures, development of polymer-based hole transport materials is expected.

For example, organic light-emitting device materials obtained by polymerization of low-molecular weight materials through partial substitution of the low-molecular weight material with a vinyl group are disclosed in the following documents:
JP1995-090255
JP1996-054833
JP1996-269133
JP2001-098023
JP2002-110359
JP2003-313240
JP2004-059743
JP2006-237592
JP2008-198989
JP2008-218983

However, organic light-emitting devices manufactured using the organic light-emitting devices materials disclosed in the above-identified documents by the solution coating method may have insufficient emission lifespan.

Therefore, to address this drawback, the present disclosure provides a polymer having a novel structure that may improve emission efficiency and emission lifespan of an organic light-emitting device, an organic light-emitting device material including the polymer, and an organic light-emitting device including the organic light-emitting device material.

Hereinafter, embodiments of a polymer, an organic light-emitting device material including the polymer, and an organic light-emitting device including the organic light-emitting device material will now be described in greater detail with reference to the appended drawings. The present embodiments may have different forms and should not be construed as being limited to the descriptions set forth herein.

Polymer

Taking into account that low emission efficiency of a conventional organic light-emitting device may be due to leakage of excitons from an emission layer to a hole transport layer in the organic light-emitting device, the inventors of the present application have carried out research into organic light-emitting device materials capable of improving the emission efficiency of the organic light-emitting device, and found, as a result of the research, that the energy level of the triplet excited state ($T_1$) in an organic layer, for example, the hole transport layer of the organic light-emitting device is increased by incorporating a polymer obtained by polymerization of polymerizable monomers containing a specific condensed cyclic structure at a side chain thereof, into the hole transport layer. The inventors also found that the use of such a polymer may suppress leakage of excitons from the emission layer to the hole transport layer, thus confining the excitons within the emission layer, and consequentially may improve emission efficiency of the organic light-emitting device and further improve the emission lifespan thereof.

An embodiment of the present disclosure provides a polymer obtained by polymerization of polymerizable monomers containing a specific condensed cyclic structure at a side chain thereof. The polymer may have improved solubility and coating stability, and thus, may improve emission efficiency and emission lifespan of an organic light-emitting device.

In some embodiments, the polymer obtained by polymerization of polymerizable monomers may include a first repeating unit represented by Formula 1.

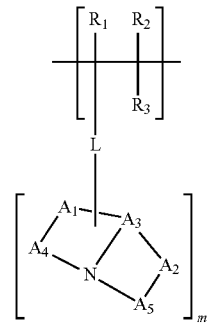

Formula 1

In Formula 1, $R_1$, $R_2$ and $R_3$ may each independently be selected from a hydrogen, deuterium, a fluorine, a C1-C10 alkyl silyl group, a C6-C30 aryl silyl group, a substituted or unsubstituted C1-C10 alkyl group, a substituted or unsubstituted C6-C30 aryl group, and a substituted or unsubstituted C1-C30 heteroaryl group, L may be selected from a single bond, a substituted or unsubstituted C1-C10 alkylene group, a substituted or unsubstituted C5-C30 cycloalkylene group, a substituted or unsubstituted C6-C30 arylene group, and a substituted or unsubstituted C1-C30 heteroarylene group, excluding a substituted or unsubstituted carbazolylene group, $A_1$ and $A_2$ may each independently be selected from a single bond, an oxygen atom, a sulfur atom, a substituted or unsubstituted C1-C10 alkylene group, a substituted or unsubstituted C6-C30 arylene group, and a substituted or unsubstituted C1-C30 heteroarylene group, $A_3$ may be selected from a substituted or unsubstituted trivalent C1-C10 alkyl group, a substituted or unsubstituted trivalent C6-C30 aryl group, and a substituted or unsubstituted trivalent C1-C30 heteroaryl group, $A_4$ and $A_5$ may each independently be selected from a substituted or unsubstituted C1-C10 alkylene group, a substituted or unsubstituted C6-C30 arylene group, and a substituted or unsubstituted C1-C30 heteroarylene group, and m may be an integer from 1 to 10.

In some embodiments, the first repeating unit represented by Formula 1 may be a repeating unit represented by Formula 2.

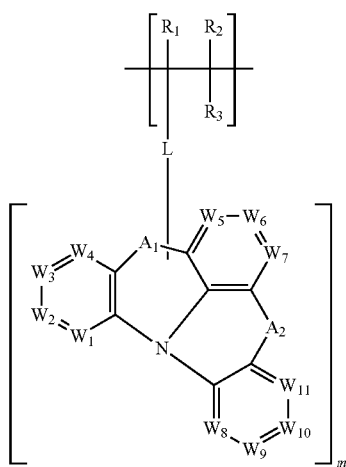

Formula 2

In Formula 2, $R_1$, $R_2$, $R_3$, L, $A_1$, $A_2$ and m may be defined the same as those defined above in connection with Formula 1, $W_1$ to $W_{11}$ may each independently be N or CX, and X may be selected from a hydrogen, deuterium, a C1-C10 alkyl silyl group, a C6-C30 aryl silyl group, a C1-C10 alkyl amino group, a C6-C60 aryl amino group, a substituted or unsubstituted C1-C10 alkyl group, a substituted or unsubstituted C6-C30 aryl group, and a substituted or unsubstituted C1-C30 heteroaryl group.

In some embodiments, the polymer may further include a second repeating unit represented by Formula 1, and the first repeating unit represented by Formula 1 and the second repeating unit represented by Formula 1 may have different structures.

In some embodiments, in Formula 1, L may be selected from a single bond, a substituted or unsubstituted C6-C15 arylene group, and a substituted or unsubstituted C5-C15 heteroarylene group, excluding a substituted or unsubstituted carbazolylene group.

In some other embodiments, L may be selected from a single bond and a substituted or unsubstituted C6-C15 arylene group.

For example, L may be selected from a single bond, a substituted or unsubstituted phenylene group, a substituted or unsubstituted naphthylene group, a substituted or unsubstituted anthracenylene group, a substituted or unsubstituted biphenylene group, a substituted or unsubstituted terphenylene group, and a substituted or unsubstituted fluorenylene group.

In some other embodiments, L may be selected from a single bond, a substituted or unsubstituted phenylene group, a substituted or unsubstituted naphthylene group, and a substituted or unsubstituted fluorenyl group.

For example, L may be selected from a single bond, a phenylene group, a naphthylene group, and a fluorenyl group substituted with an alkyl group.

In some embodiments, in Formula 1, m may be 1, 2 or 3. For example, m may be 1 or 2.

In some embodiments, $A_1$ and $A_2$ may each independently be selected from a single bond, an oxygen atom, and a sulfur atom.

In some embodiments, $W_1$ to $W_{11}$ may each independently a CX, wherein X may be selected from a hydrogen, deuterium, a C1-C10 alkyl silyl group, a C6-C30 aryl silyl group, a C1-C10 alkyl amino group, a C6-C60 aryl amino group, a substituted or unsubstituted C1-C10 alkyl group, a substituted or unsubstituted C6-C30 aryl group, and a substituted or unsubstituted C1-C30 heteroaryl group. In other words, $W_1$ to $W_{ii}$ may each independently a carbon atom substituted with X.

In some embodiments, X may be selected from a hydrogen atom, a substituted or unsubstituted C1-C10 alkyl group, a substituted or unsubstituted C6-C30 aryl amino group, and a substituted or unsubstituted C6-C15 aryl group. For example, X may be selected from a hydrogen atom, an aryl amino group, a phenyl group, a naphthyl group, a phenanthryl group, a biphenylyl group, a terphenyl group, and a fluorenyl group.

In some embodiments, the first repeating unit represented by Formula 1 or Formula 2 may be a nitrogen-containing condensed cyclic structure bound to a side chain of the polymer via L. The nitrogen-containing condensed cyclic structure may be selected from the structures represented by the following formulas. However, embodiments are not limited thereto. The nitrogen-containing condensed cyclic structure may bind to any site in a backbone of the polymer.

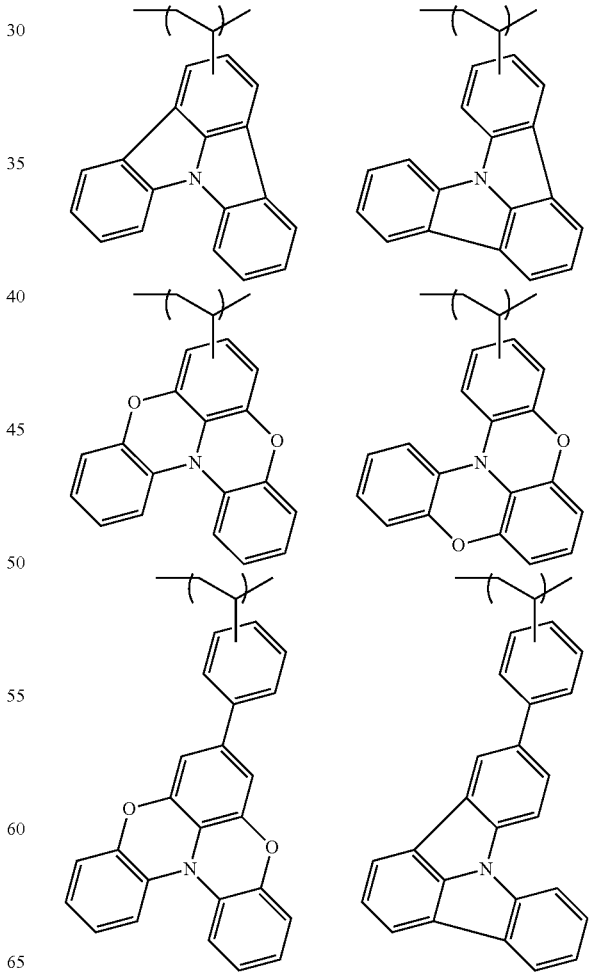

In some embodiments, a plurality of nitrogen-containing condensed cyclic structures may be linked to a side chain(s) of the polymer via L. For example, two nitrogen-containing condensed cyclic structures represented by the following formulae may be linked to the side chain of the polymer, i.e., wherein m is 2. However, embodiments are not limited thereto.

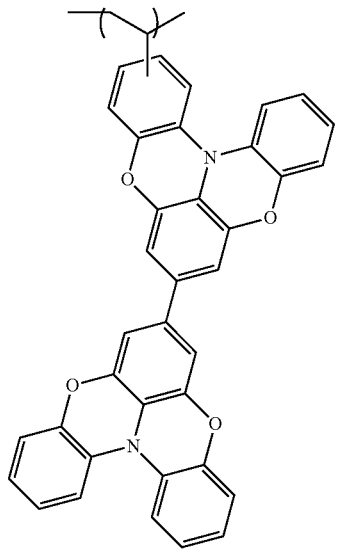

-continued

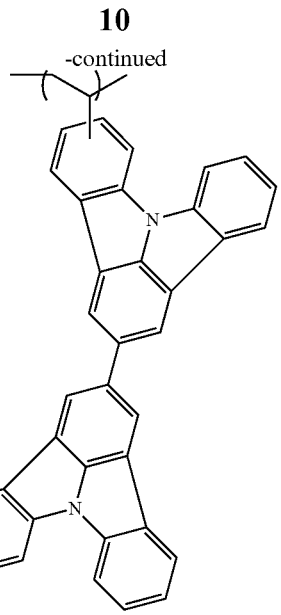

In some embodiments, the nitrogen-containing condensed ring may be substituted with at least one substituent. For example, the first repeating unit represented by Formula 1 may be selected from the structures represented by the following formulae. However, embodiments are not limited thereto.

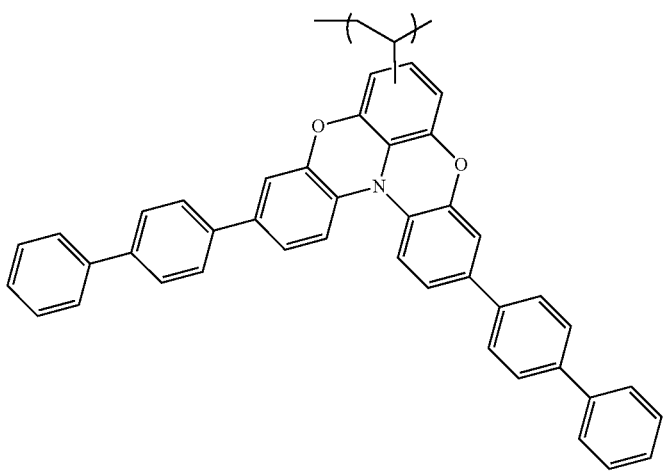

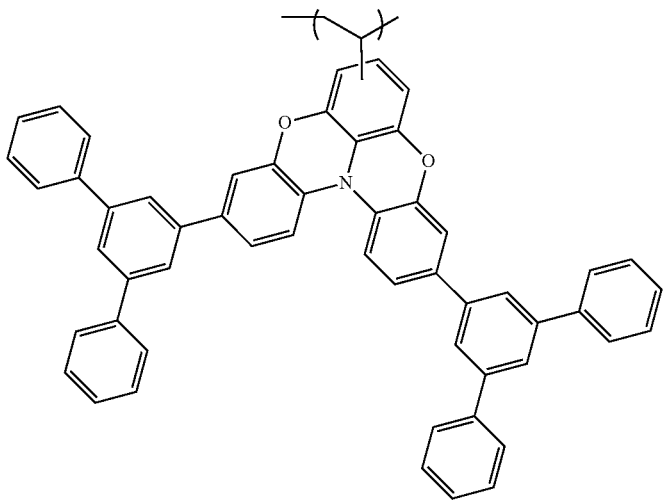

-continued
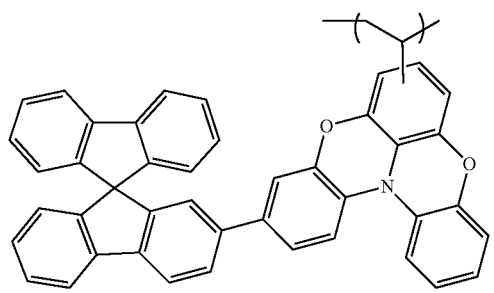
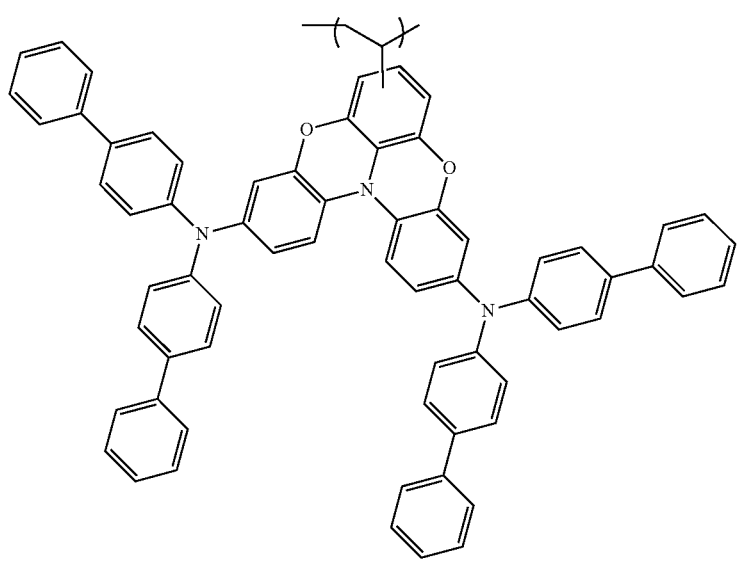
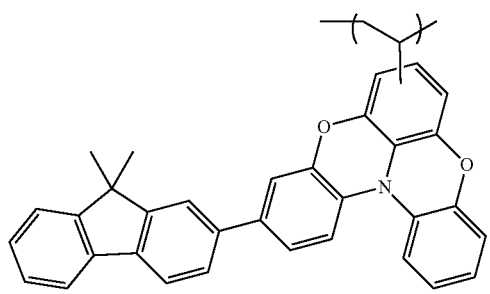
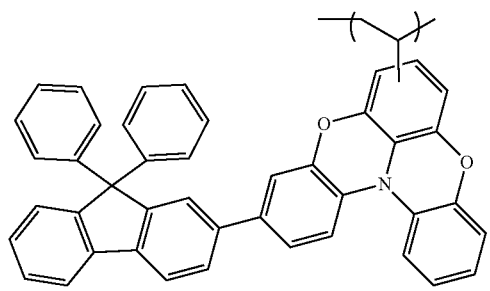

-continued
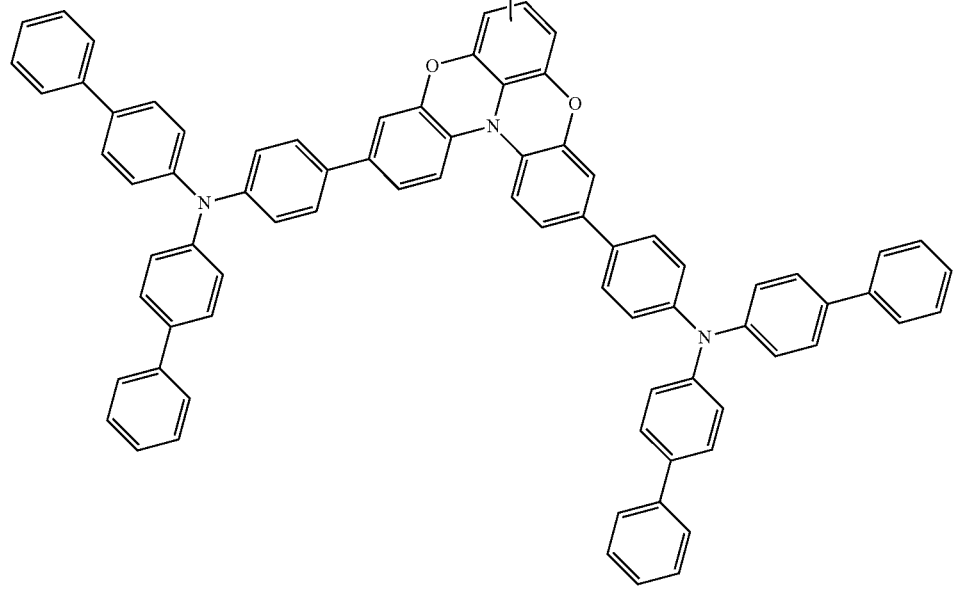
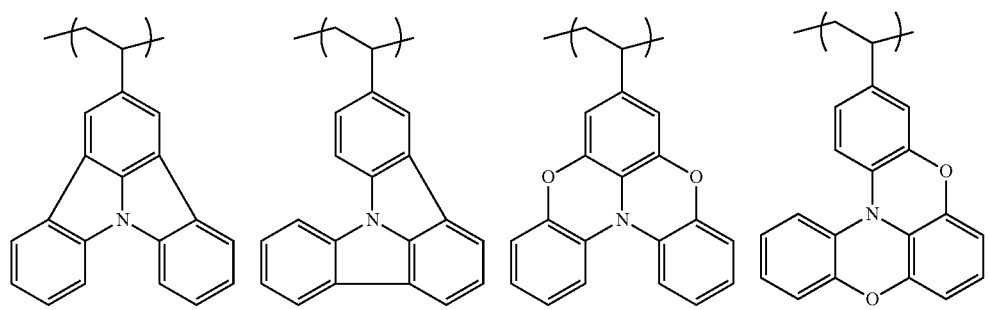
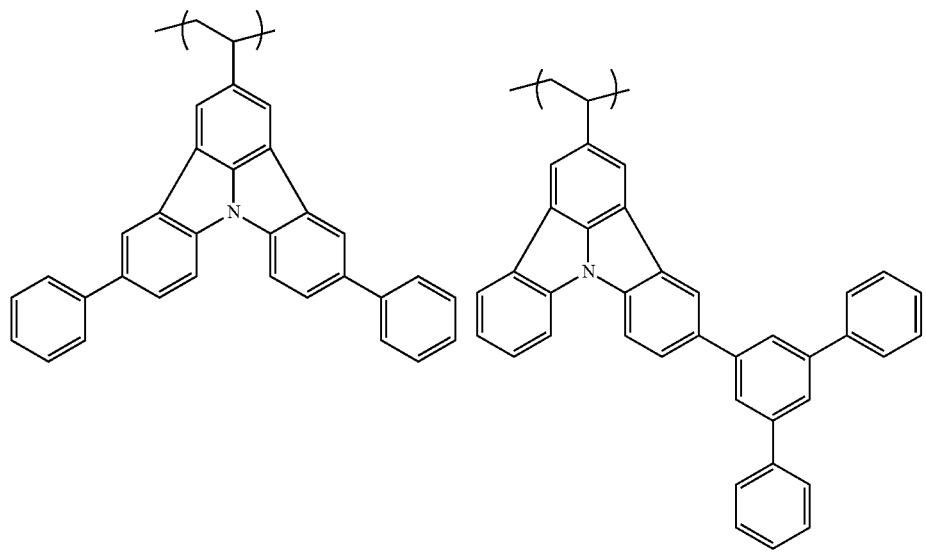

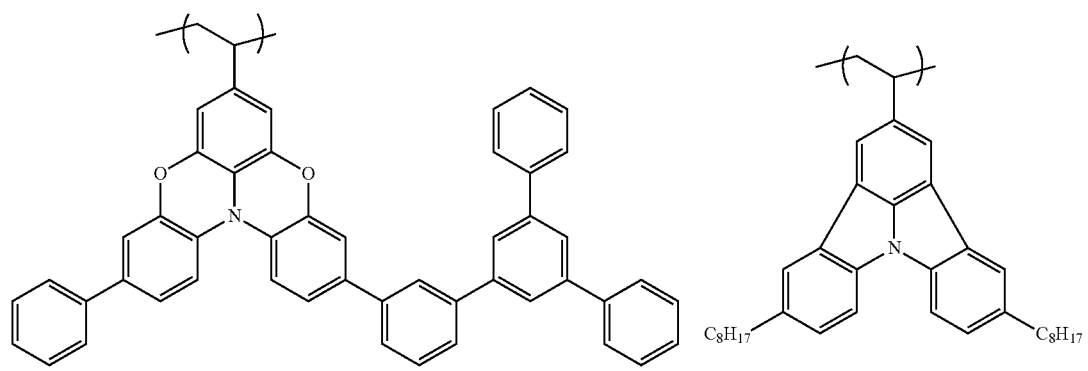
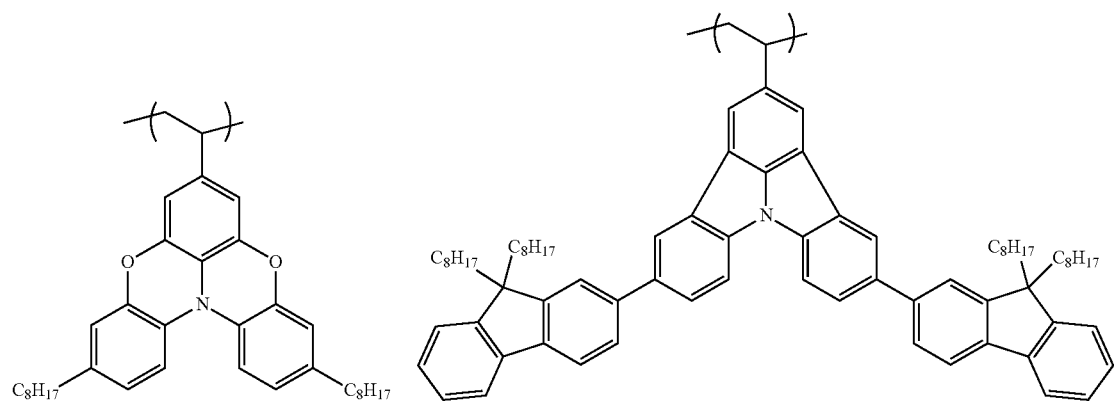
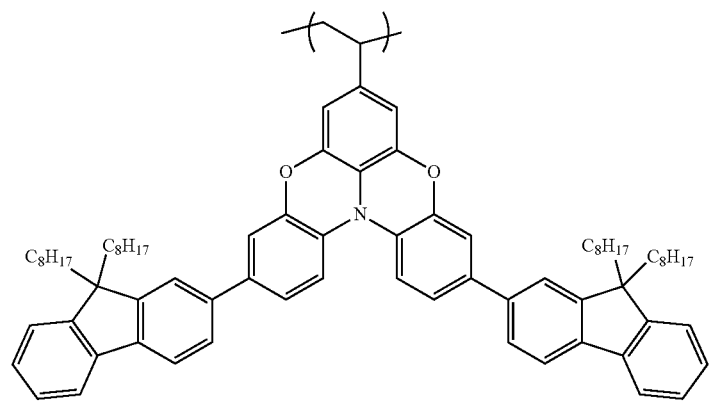

-continued
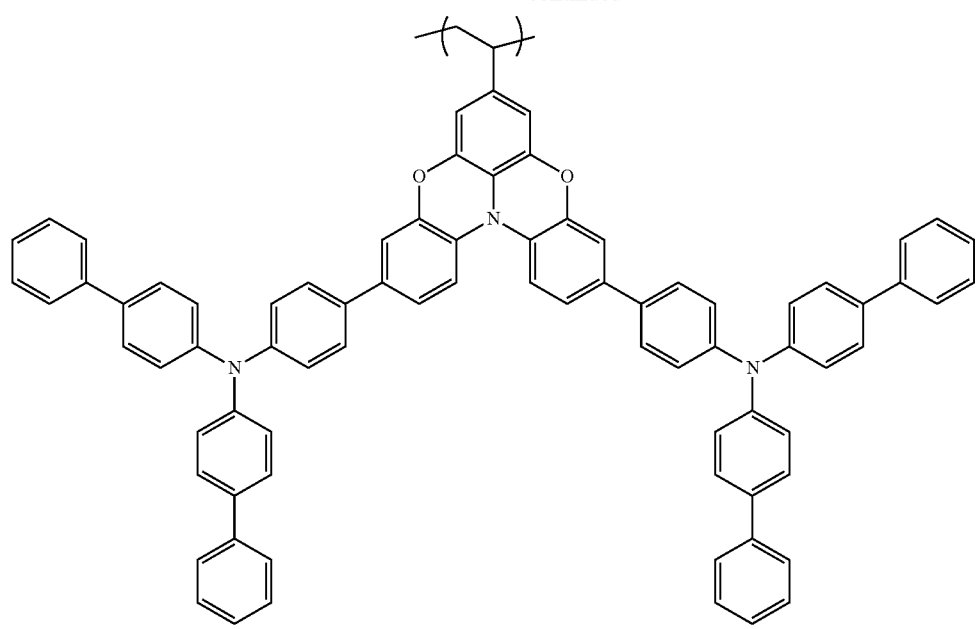
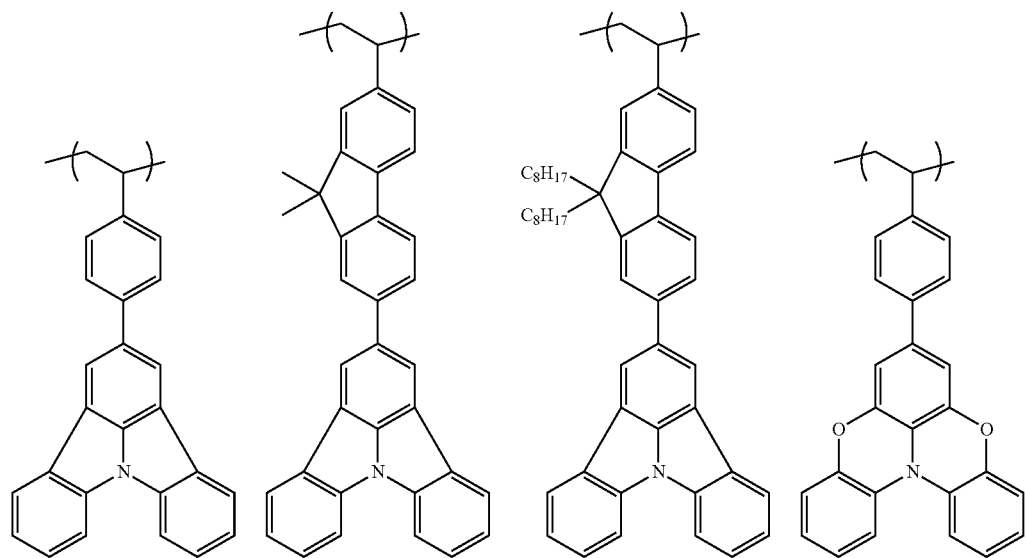

-continued

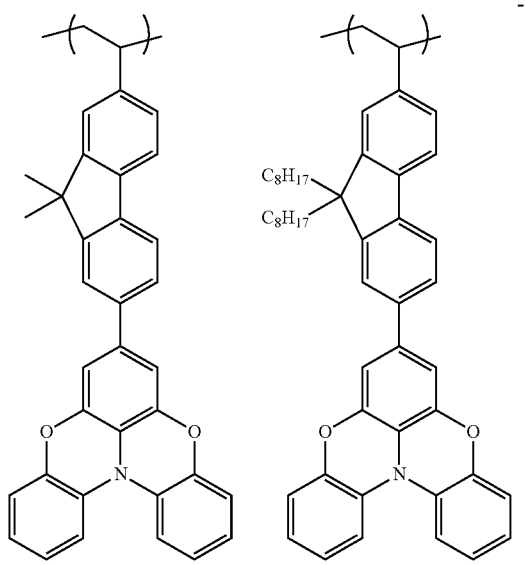

In some embodiments, the polymer may further include a cross-linking group. For example, the cross-linking group may be selected from the structures represented by the following formulae. However, embodiments are not limited thereto.

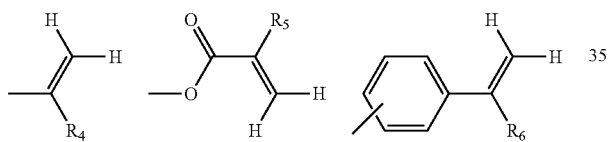

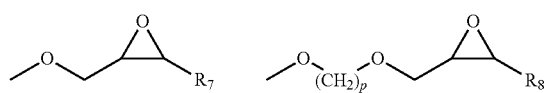

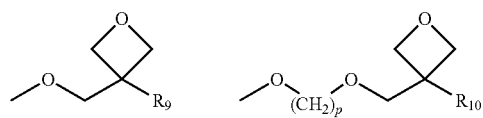

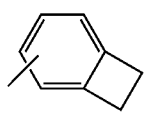

In the above formulae, $R_4$ to $R_{10}$ may each independently be a hydrogen, or a substituted or unsubstituted C1-C10 alkyl group, and p may be an integer from 1 to 10.

In some embodiments, a polymerizable monomer including the first repeating unit represented by Formula 1 or Formula 2 and a cross-linking group may be selected from structures represented by the following formulae. However, embodiments are not limited thereto.

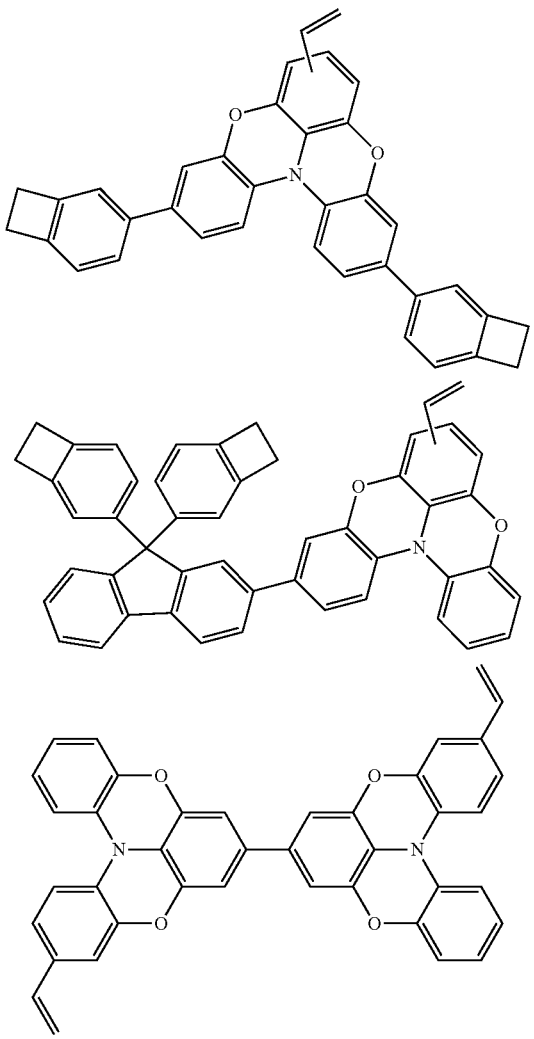

-continued

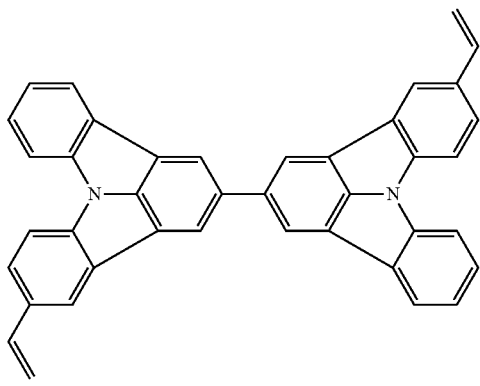

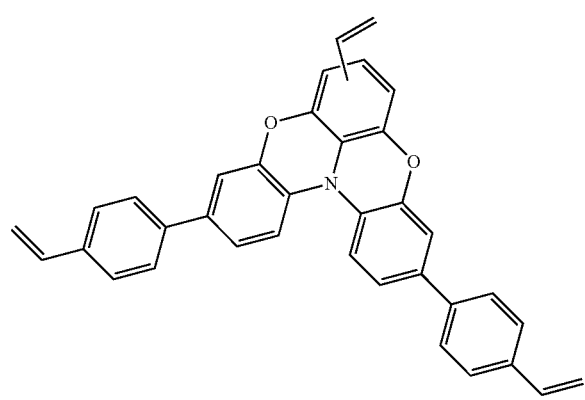

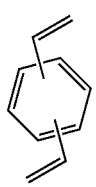

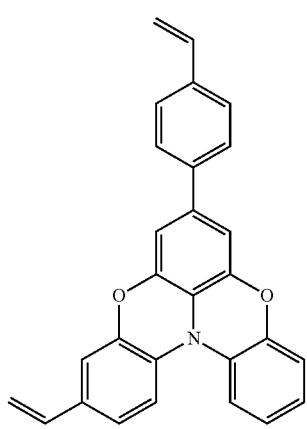

-continued

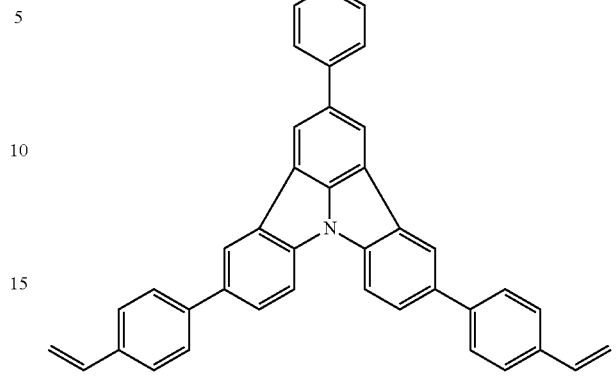

In some embodiments, the polymer may be a polymer obtained from polymerization of a polymerizable monomer alone including the first repeating unit represented by Formula 1 or Formula 2. In some embodiments, the polymer may be a copolymer obtained from copolymerization of a polymerizable monomer including the repeating unit represented by Formula 1 or Formula 2 and a different polymerizable monomer. In other words, the polymer may be any polymer including the first repeating unit represented by Formula 1 or Formula 2.

As described above, a polymer according to any of the above-described embodiments may include a specific condensed cyclic structure at a side chain thereof. Since the polymer including a specific condensed cyclic structure has a high energy level in triplet excited state ($T_1$), when used in, for example, a hole transport layer, the polymer may suppress leakage of excitons from the emission layer to the hole transport layer, thus confining the excitons within the emission layer. Accordingly, the polymer may improve emission efficiency and further emission lifespan of an organic light-emitting device.

In some embodiments, the polymer may have a number average molecular weight of, for example, about 10,000 to about 100,000 Daltons (Da), or and in some other embodiments, about 10,000 or greater and 100,000 Da or less. In some embodiments, the polymer may have a polydispersity index of, for example, about 1.5 to 2.5, and in some other embodiments, about 1.5 or greater and 2.5 or less, wherein the polydispersity index is defined as a value obtained by dividing weight average molecular weight by number average molecular weight.

As described above, a polymer according to any of the above-described embodiments may form a film by a solution coating method, and may improve emission efficiency and emission lifespan of an organic light-emitting device. When the polymer includes a cross-linking group, the polymer may have improved coating stability due to cross-linking after being coated. Accordingly, when the polymer is used to form a stack structure of an organic light-emitting device, the organic light-emitting device may have improved emission characteristics and improved stability.

In some embodiments, the polymer may be synthesized using a known organic synthesis method. Detailed synthesis methods of the polymer may be understood by one of ordinary skill in the art based on the examples which are to be described below.

As used herein, the "alkyl group" may refer to a linear or branched aliphatic saturated hydrocarbon monovalent group having a specified number of carbon atoms. The "alkyl group" may be a linear or branched alkyl group, and may be, for example, a methyl group, an ethyl group, a propyl group, an iso-propyl group, an n-butyl group, a sec-butyl group, an iso-butyl group, t-butyl group, an n-pentyl group, an n-hexyl group, an n-heptyl group, or an n-octyl group.

As used herein, the "cycloalkyl group" may refer to a monovalent saturated hydrocarbon monocyclic saturated group having a specified number of carbon atoms. The "cycloalkyl group" may be a monocyclic hydrocarbon group a bridged hydrocarbon group, or tricycloalkyl group, and may be, for example, a cyclopropyl group, a cyclobutyl group, a cyclopentyl group, a cyclohexyl group, an adamantyl group, or an norbornyl group.

As used herein, the "aryl group" may refer to a monovalent group having an aromatic system having a specified number of carbon atoms. The "aryl group" may be a monocyclic aromatic group or a condensed polycyclic aromatic group, and may be, for example, a phenyl group, a naphthyl group, an anthracenyl group, a phenanthrenyl group, a biphenylyl group, a terphenyl group, a tolyl group, a fluoranthenyl group, or a fluorenyl group.

As used herein, the "heteroaryl group" may refer to a monovalent group having a heterocyclic aromatic system that has at least one heteroatom selected from N, O, P, and S as a ring-forming atom, and a specified number of carbon atoms. The "heteroaryl group" may be a monocyclic aromatic group or a condensed polycyclic aromatic group, and may be, for example, a pyrrolyl group, a pyrazinyl group, a pyridinyl group, an indolyl group, an isoindolyl group, a furyl group, a benzofuranyl group, an isobenzofuranyl group, a quinolyl group, an isoquinolyl group, a quinoxalinyl group, a carbazolyl group, a phenanthridinyl group, an acridinyl group, a phenazinyl group, a phenothiazinyl group, a phenoxazinyl group, an oxazolyl group, an oxadiazolyl group, a furazanyl group, or a thienyl group.

As used herein, the "alkylene group, the "cycloalkylene group," the "arylene group," and the "heteroarylene group" may refer to divalent groups obtained by removing one hydrogen atom from an alkyl group, a cycloalkyl group, an aryl group, and a heteroaryl group as listed above, respectively.

As used herein, the "alkyl silyl group" may refer to a monovalent to trivalent silicon (Si) atom substituted with such an alkyl group as listed above, and the "aryl silyl group" may refer to a monovalent to trivalent silicon (Si) atom substituted with such an aryl group as listed above. The "alkyl amino group" may refer to a monovalent to trivalent nitrogen atom substituted with such an alkyl group as listed above, and the "aryl amino group" may refer to a monovalent to trivalent nitrogen atom substituted with such an aryl group as listed above.

As used herein, the "substituted" may refer to being substituted with a substituent, for example, any one of the above-described alkyl group, aryl group, and heteroaryl group.

When a group containing a specified number of carbon atoms is substituted with any of the groups listed in the preceding paragraph, the number of carbon atoms in the resulting "substituted" group is defined as the sum of the carbon atoms contained in the original (unsubstituted) group and the carbon atoms (if any) contained in the substituent. For example, when the term "substituted C1-C30 alkyl" refers to a C1-C30 alkyl group substituted with C6-C30 aryl group, the total number of carbon atoms in the resulting aryl substituted alkyl group is C7-C60.

Organic Light-Emitting Device Material

According to an aspect of the present disclosure, there is provided an organic light-emitting device material including a polymer according to any of the above-described embodiments. The polymer may have application as an organic light-emitting device material. The polymer may have hole transport and hole injection abilities. Thus, the organic light-emitting device material according to an embodiment may be used as, for example, a material of a hole transport layer, a hole injection layer, and an emission layer.

In some embodiments, the organic light-emitting device material may be a material of the emission layer, and the polymer according to any of the above-described embodiment may be used as a host material. In this case, the organic light-emitting device material may further include a compound with hole transport ability.

The compound with hole transport ability is not specifically limited, and may be, for example, a hole injection material, a hole transport material, or a host material which are known in the art, which will be described below.

In some embodiments, the organic light-emitting device material may be a material of the emission layer, and may further include a light-emitting material, which may be selected from light-emitting materials which will be described below.

An organic light-emitting device material according to an embodiment may include a polymer according to any of the above-described embodiments, and a solvent. In some embodiments, the organic light-emitting device material may be used, for example, to form a layer of an organic light-emitting device by using a solution coating method.

The solvent is not specifically limited, and may be, for example, a solvent capable of dissolving the organic light-emitting device material.

In some embodiments, the solvent may be, for example, an aromatic solvent, such as toluene, xylene, ethylbenzene, diethylbenzene, mesitylene, propylbenzene, cyclohexylbenzene, dimethoxybenzene, anisole, ethoxy toluene, phenoxy toluene, iso-propylbiphenyl, dimethylanisole, phenyl acetate, phenyl propionate, methyl benzoate, and ethyl benzoate. However, embodiments are not limited thereto.

Organic Light-Emitting Device

An organic light-emitting device according to an embodiment will be described in detail with reference to FIG. 1.

Referring to FIG. 1, an organic light-emitting device 100 according to an embodiment may include a substrate 110, a first electrode 120 disposed on the substrate 110, a hole injection layer 130 disposed on the first electrode 120, a hole transport layer 140 disposed on the hole injection layer 130, an emission layer 150 disposed on the hole transport layer 140, an electron transport layer 160 disposed on the emission layer 150, an electron injection layer 170 disposed on the electron transport layer 160, and a second electrode 180 disposed on the electron injection layer 170, i.e., which are sequentially in the stated order. However, the organic light-emitting device 100 may have a structure not limited thereto.

The substrate 110 may be any substrate used in general organic light-emitting devices. For example, the substrate 110 may be a glass substrate, a silicon substrate, or a transparent plastic substrate.

The first electrode 120 may be formed on the substrate 110. The first electrode 12 may be, for example, an anode. The first electrode 12 may be formed of a metal, an alloy, or a conductive compound that have high work function. For example, first electrode 120 may be formed of a material having good transparency and good conductivity, for example, indium tin oxide (ITO), indium zinc oxide (IZO), tin oxide ($SnO_2$), or zinc oxide (ZnO). The first electrode 120 may be formed as a reflective electrode from, for example, magnesium (Mg) or aluminum (Al).

The hole injection layer 130 may be formed on the first electrode 120. The hole injection layer 130 may facilitate injection of holes from the first electrode 120. The hole injection layer 130 may have a thickness of about 10 nanometers (nm) to about 1,000 nm, and in some embodiments, about 10 nm to about 100 nm.

The hole injection layer 130 may be formed of a known hole injection material, for example, triphenylamine-containing poly(ether ketone) (TPAPEK), 4-iso-propyl-4'-methyldiphenyl iodonium tetrakis (pentafluorophenyl) borate (PPBI), N,N'-diphenyl-N,N'-diphenyl-N,N'-bis-[4-(phenyl-m-tolyl-amino)-phenyl]-biphenyl-4,4'-diamine (DNTPD), copper phthalocyanine, 4,4',4''-tris(3-methyl phenyl amino) triphenylamine (m-MTDATA), N,N'-di(1-naphthyl)-N,N'-diphenylamine (NPB), 4,4',4''-tris(N,N'-2-naphthylphenylamino) triphenylamine (2-TNATA), polyaniline/dodecylbenzene sulfonic acid, poly(3,4-ethylenedioxythiophene)/poly(4-styrene sulfonate), or polyaniline/10-camphor sulfonic acid.

The hole transport layer 140 may be formed on the hole injection layer 130. The hole transport layer 140 may include a hole transporting material with the ability to form holes. The hole transport layer 140 may have a thickness of about 10 nm to about 150 nm. The hole transport layer 140 may be formed using a polymer according to any of the above-described embodiments by a solution coating method. This method using the polymer may improve emission lifespan of the organic light-emitting device 100 and may facilitate formation of a large-area film.

The emission layer 150 may be formed on the hole transport layer 140. The emission layer 150 may be a fluorescent or phosphorescent emission layer. The emission layer 150 may be formed by a vacuum deposition method, a spin coating method, or an ink jet method. The emission layer 150 may have a thickness of, for example, about 10 nm to about 60 nm.

The emission layer 150 may include a known light-emitting material. For example, the emission layer 150 may include a light-emission material that may emit light (phosphorescence) from triplet excitons. This may further improve emission lifespan of the organic light-emitting device 100.

The emission layer 150 may include a host material, for example, tris(8-quinolinolinato) aluminum ($Alq_3$), 4,4'-N,N'-dicabazole-biphenyl (CBP), poly(n-vinylcarbazole) (PVK), 9,10-di(naphthalene-2-yl)anthracene (ADN), 4,4',4''-tris(N-carbazole)triphenylene (TCTA), 1,3,5-tris(N-phenyl-benzimidazole-2-yl)benzene (TPBI), 3-tert-butyl-9,10-di(naphth-2-yl)anthracene (TBADN), distyrylarylene (DSA), or 4,4'-bis(9-carbazol)-2,2'-dimethylbiphenyl (dm-CBP).

The emission layer 150 may include a dopant material. Examples of the dopant material may include perylene and a derivative thereof, rubrene and a derivative thereof, coumarin and a derivative thereof, 4-(dicyanomethylene)-2-methyl-6-[p-(dimethylamino)styryl]-4H-pyran) (DCM) and a derivative thereof, an iridium (Ir) complex such as bis[2-(4,6-difluorophenyl) pyridinate]picolinate iridium (III) (Flrpic), bis(1-phenylisoquinoline)(acetylacetonato)iridium (III) [Ir(piq)$_2$(acac)], and tris(2-phenylpyridine) iridium(III) [Ir(ppy)$_3$], an osmium (Os) complex, and a platinum (Pt) complex.

The electron transport layer 160 may be formed on the emission layer 150. The electron transport layer 160 may be a layer capable of transporting electrons. The electron transport layer 160 may be formed by, for example, a vacuum deposition method, a spin coating method, or an inkjet method. For example, the electron transport layer 160 may have a thickness of about 15 nm to about 50 nm.

The electron transport layer 160 may be formed of a known electron transport material. Examples of the known electron transport material are tris(8-quinolinolinato) aluminum ($Alq_3$) and a compound having a nitrogen-containing aromatic ring. Examples of the nitrogen-containing aromatic ring are a pyridine ring-containing compound such as (1,3,5-tri[(3-pyridyl)-phenyl-3-yl]benzene), a triazine ring-containing compound such as 2,4,6-tris(3'-(pyridin-3-yl) biphenyl-3-yl)-1,3,5-triazine, and an imidazole ring-containing compound such as 2-(4-(N-phenylbenzoimidazolyl-1-yl-phenyl)-9,10-dinaphthylanthracene). In some embodiments, the electron transport layer 160 may use a commercially available electron transport material, for example, KLET-01, KLET-02, KLET-03, KLET-10, or KLET-M1 (available from Chemipro Kasei).

The electron injection layer 170 may be formed on the electron transport layer 160. The electron injection layer 170 may facilitate injection of electrons from the second electrode 180. The electron injection layer 170 may be formed on the electron transport layer 160 by, for example, a vacuum deposition method. For example, the electron injection layer 170 may have a thickness of about 0.3 nm to about 9 nm.

The electron injection layer 170 may be formed of a known electron injection material, for example, (8-quinolinato)lithium (Liq), lithium fluoride (LiF), sodium chloride (NaCl), cesium fluoride (CsF), lithium oxide ($Li_2O$), barium oxide (BaO), or the like.

The second electrode 180 may be formed on the electron injection layer 170. The second electrode 180 may be, for example, a cathode. The second electrode 180 may be formed of a metal, an alloy, or a conductive compound that have a low work function. For example, the second electrode 180 may be formed of lithium (Li), magnesium (Mg), aluminum (Al), calcium (Ca), an aluminum-lithium (Al—Li) alloy, a magnesium-indium (Mg—In) alloy, a magnesium-silver (Mg—Ag) alloy, or the like. In some embodiments, the second electrode 180 may be formed as a transmissive electrode, for example, from indium tin oxide (ITO), indium zinc oxide (IZO), or the like.

Exemplary embodiments of the structure of the organic light-emitting device 100 have been described above. The organic light-emitting device 100 according to an embodiment may have improved emission lifespan, due to the inclusion of a polymer according to any of the above-described embodiments.

Exemplary embodiments of the structure of the organic light-emitting device 100 are described above. However, embodiments are not limited to the above-described structures of the organic light-emitting device 100. The organic light-emitting device 100 as an embodiment of the present disclosure may have any of known various structures. For example, the organic light-emitting device 100 may have a structure without at least one of the hole injection layer 130, the hole transport layer 140, the electron transport layer 160, and the electron injection layer 170. Each of these layers of the organic light-emitting device 100 may be formed as a single layer or multiple layers.

For example, the organic light-emitting device 100 may further include a hole blocking layer between the hole transport layer 140 and the emission layer 150 to prevent diffusion of triplet excitons or holes into the electron transport layer 160. For example, the hole blocking layer may be formed of an oxadiazole derivative, a triazole derivative, a phenanthroline derivative, or the like.

One or more embodiments of polymers, organic light-emitting device materials, organic light-emitting device preparation compositions, and organic light-emitting devices according to the present disclosure will now be described in detail with reference to the following examples. However, these examples are only for illustrative purposes and are not intended to limit the scope of the one or more embodiments of the present disclosure.

EXAMPLES

Synthesis of Polymer A

As an exemplary synthesis method of a polymer according to an embodiment, a method of synthesizing polymer A will now be described in detail. The synthesis method to be described below is only for illustrative purposes, and thus, the synthesis method of a polymer according to an embodiment is not limited to the following method.

First, a compound 3 was synthesized according to Reaction Scheme 1.

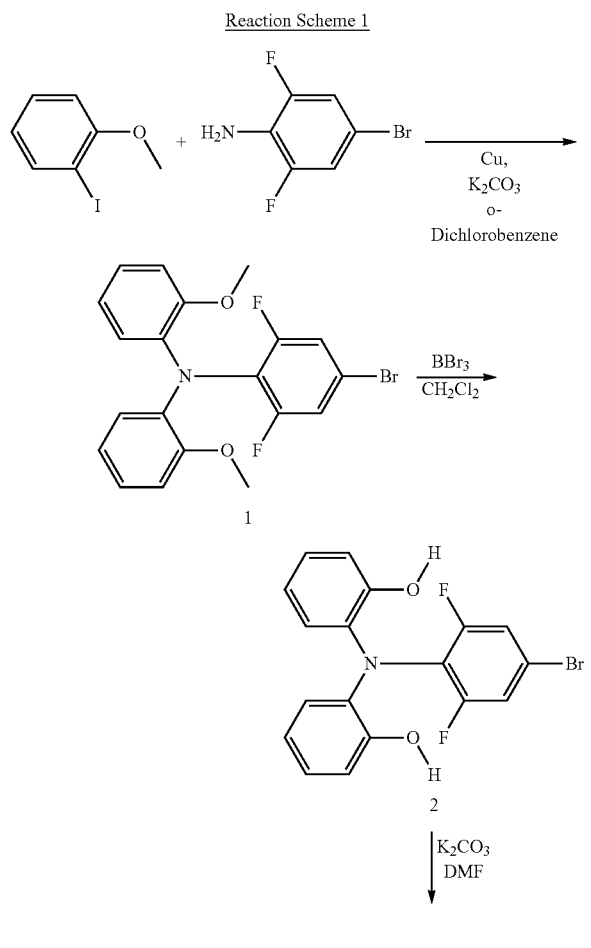

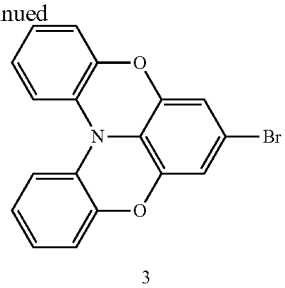

40.0 grams (g) (192.3 millimoles, mmol) of 2-iodoanisole, 100.0 g (427.3 mmol) of 4-bromo-2,6-difluoroaniline, 111.0 g (803.2 mmol) of potassium carbonate ($K_2CO_3$), 15.6 g (246.0 mmol) of copper, and 520 milliliters (mL) of o-dichlorobenzene were added into a 2-L (two liter), four-neck flask under argon atmosphere and stirred at about 180° C. for about 80 hours. After termination of the reaction, the resulting mixture was cooled down to room temperature, and separated from the impurities by filtration through a Celite (Registered trademark). After removing the solvent, the resulting product was washed three times with 300 mL of hexane to obtain compound 1 as a white powder (48.0 g, 114.2 mmol, Yield: 26.7%)

Next, 47.00 g (111.84 mmol) of the compound 1 and 1,800 mL of anhydrous dichloromethane were added into a 3-L (three liter), four-neck flask under argon atmosphere, and the resulting mixture was stirred at about −75° C. for about 15 minutes. Then, 230 mL of a 1.0 molar (M) tribromoboronic acid dichloromethane solution was dropwise added thereto. After the temperature was slowly increased to room temperature, the resulting product was stirred for about 5 hours. 100 mL of water was added to the reaction solution, followed by extraction three times with dichloromethane. An organic phase was collected, concentrated, and purified by column chromatography to thereby obtain compound 2 (38.0 g, 96.9 mmol, Yield: 86.6%).

Subsequently, 37.0 g (94.35 mmol) of the compound 2, 39.00 g (283.00 mmol) of potassium carbonate, and 500 mL of dimethylformamide were added into a 2-L, four-neck flask under argon atmosphere and stirred at about 100° C. for about 10 hours. The resulting mixture was cooled down to room temperature, and 1,000 mL of water was added thereto to precipitate a white solid. This white solid was purified by recrystallization using a mixed solvent of chloroform and hexane to thereby obtain compound 3 (26.3 g, 74.7 mmol, Yield: 79.1%).

Next, a monomer A was synthesized according to Reaction Scheme 2.

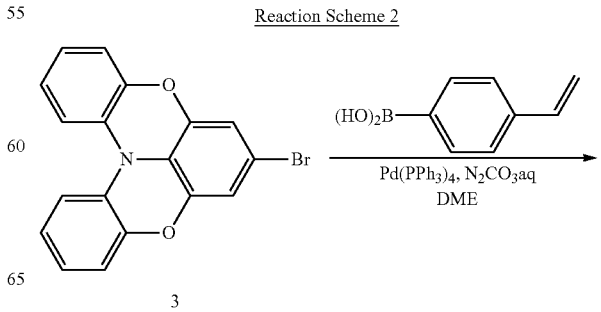

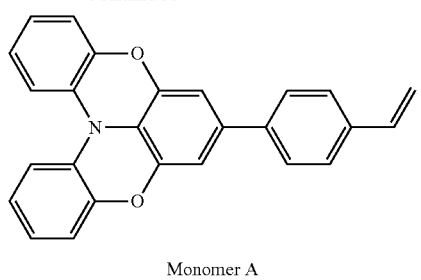

Monomer A 2.00 g (5.68 mmol) of the compound 3, 0.92 g (6.25 mmol) of vinylphenylboronic acid, 0.20 g (0.17 mmol) of tetrakis(triphenylphosphine)palladium, 30 mL of 1,2-dimethoxyethane, 4.3 mL of a 2 M aqueous sodium carbonate solution ($Na_2CO_3$ aq.) were added into a 100-mL, three-neck flask under argon atmosphere, and the mixture was stirred at about 80° C. for about 7 hours. The resulting mixture was cooled down to room temperature, followed by extraction three times with toluene/water. An organic phase was collected, concentrated, and purified by column chromatography to thereby obtain monomer A (1.97 g, Yield: 92.6%). A structure of the monomer A was identified by liquid chromatography-mass spectrometry (LC-MS).

Subsequently, 1.00 g (2.66 mmol) of the monomer A, 0.005 g (0.0305 mmol) of azobisisobutyronitrile (AIBN), and 10 mL of anhydrous toluene were added into a three-neck flask under argon atmosphere and stirred at about 80° C. for about 8 hours under argon atmosphere. The resulting mixture was cooled down to room temperature, followed by extraction with methanol and filtration to obtain a solid. This solid was dissolved in tetrahydrofuran (THF) and purified by re-precipitation with acetone to thereby obtain 0.5 g of polymer A having a structure represented by the formula below. The polymer A had a number average molecular weight (Mn) of about 21,200 Daltons and a weight average molecular weight (Mw) of about 4,840 Daltons, as measured by gel permeation chromatography (GPC).

polymer A

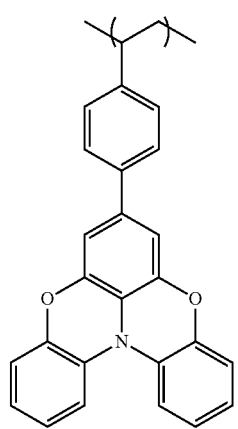

Example 1: Manufacture of Organic Light-Emitting Device

An organic light-emitting device including the above-described polymer was manufactured according to the following processes.

First, a hole injection layer was formed by spin-coating PEDOT/PSS/poly(4-styrene sulfonate) (available from Sigma-Aldrich) on a glass substrate having an indium tin oxide (ITO) first electrode (anode) in a stripe pattern to have a thickness of about 30 nanometers (nm) after dried.

Next, 1 percent by mass (mass %) of the synthesized polymer A was dissolved in xylene to prepare a hole transport layer coating solution. The hole transport layer coating solution was coated on the hole injection layer to have a thickness of about 30 nm after being dried, and then heated at about 230° C. for about 1 hour to form a hole transport layer.

Next, triphenylenyl silyl 3,6-bis(N-carbazolyl)benzene (SimCP) and 4,4'-bis(carbazole-9-yl)biphenyl (CBP) as host materials, and tris(2-(3-xylyl)phenylpyridine iridium (III) (TEG) as a dopant material were co-deposited on the hole transport layer using a vacuum deposition apparatus to form an emission layer having a thickness of about 30 nm.

The ratio of SimCP-CBP was about 7:3 by mass, and a doped amount of tris(2-3-p-xylyl)phenylpyridine iridium (III) was about 10 mass %. Tris(2-(3-p-xylyl)phenylpyridine iridium(III) is a light-emitting material that may emit light (phosphorescence) from triplet excitons.

Next, (8-quinolinolato) lithium (Liq) and KLET-03 (available from Chemipro Kasei) were co-deposited on the emission layer using the vacuum deposition apparatus to form an electron transport layer having a thickness of about 50 nm. Lithium fluoride (LiF) was then deposited on the electron transport layer using the vacuum deposition apparatus to form an electron injection layer having a thickness of about 1 nm. Aluminum was then deposited on the electron injection layer using the vacuum deposition apparatus to form a second electrode (cathode) having a thickness of about 100 nm, thereby finally manufacturing the organic light-emitting device.

Example 2 to 6 and Comparative Example 1

Organic light-emitting devices were manufactured in the same manner as in Example 1, except that their hole transport layer was formed using a different polymer as represented in Table 1, and evaluated.

polymer B

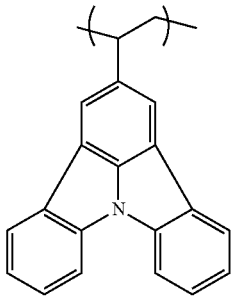

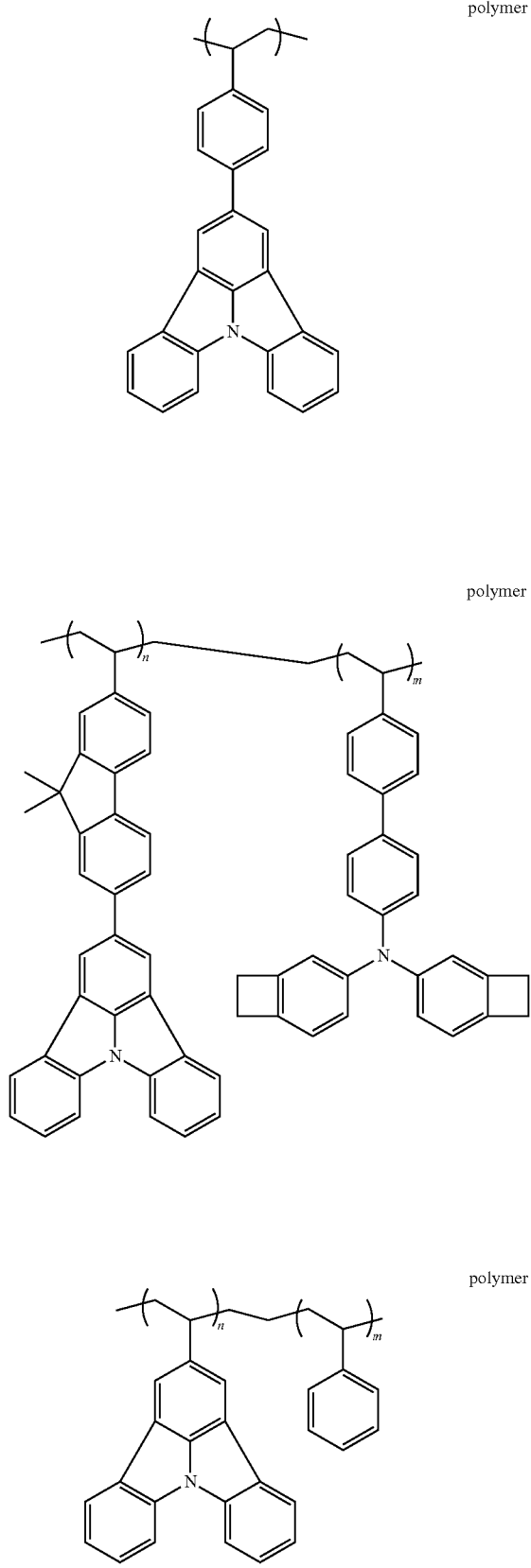

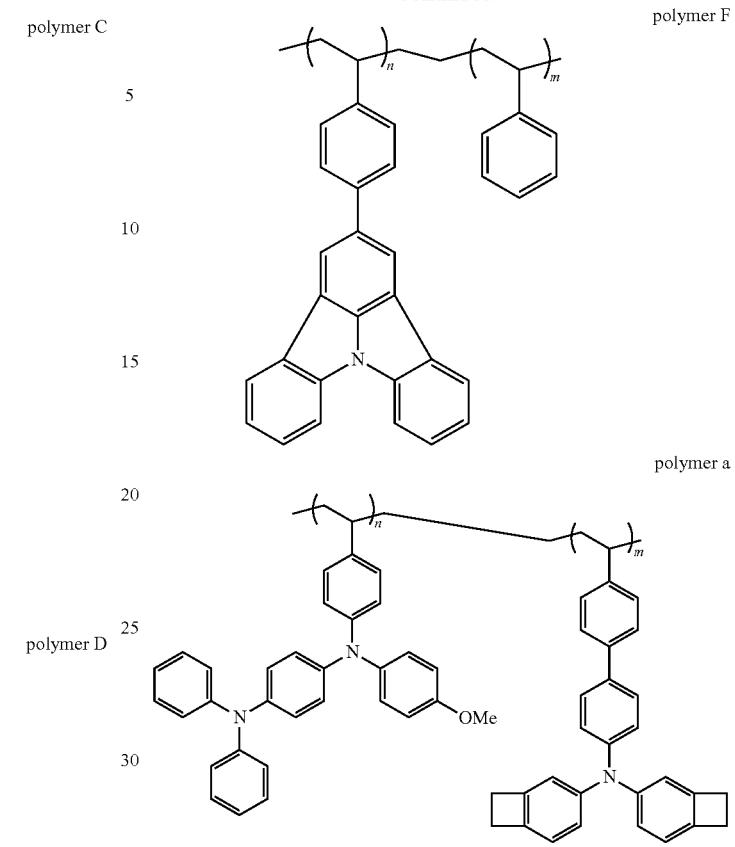

Evaluation of Organic Light-Emitting Device

The current efficiency and emission lifespan of each organic light-emitting device were evaluated according to the following methods.

A predetermined voltage was applied to each organic light-emitting device using a direct current constant-voltage power source (Source meter, available from KEYENCE) to operate the organic light-emitting device. While the emission of the organic light-emitting device was measured using a luminance measurement apparatus (SR-3, available from Topcom), the current was gradually increased to measure a current density at a luminance of about 3,000 candelas per square meter ($cd/m^2$), and then maintained constant. A current efficiency was calculated from the current density.

The emission lifespan of each organic light-emitting device was defined as the time taken until an initial luminance measured using the luminance measurement apparatus was reduced by about 80%.

The evaluation results are shown in Table 1. In Table 1, the current efficiencies, and luminance (emission) lifespans as relative values to the emission lifespan of Comparative Example 1 being assumed as 100, were represented.

TABLE 1

| | Hole transport layer | Mn | Mw | n:m | Efficiency (%) | Device lifespan (%) |
|---|---|---|---|---|---|---|
| Example 1 | polymer A | 21,200 | 48,400 | — | 120 | 1,700 |
| Example 2 | polymer B | 20,600 | 44,600 | — | 128 | 1,500 |
| Example 3 | polymer C | 22,900 | 52,700 | — | 125 | 2,000 |
| Example 4 | polymer D | 27,000 | 70,200 | 9:1 | 122 | 2,300 |

TABLE 1-continued

| | Hole transport layer | Mn | Mw | n:m | Efficiency (%) | Device lifespan (%) |
|---|---|---|---|---|---|---|
| Example 5 | polymer E | 5,380 | 18,000 | 9:1 | 118 | 1,650 |
| Example 6 | polymer F | 10,900 | 43,400 | 9:1 | 120 | 1,900 |
| Comparative Example 1 | polymer a | 23,900 | 64,100 | 9:1 | 100 | 100 |

Referring to the results in Table 1, the organic light-emitting devices of Examples 1 to 6 using polymers according to embodiments were found to have improved emission efficiency and improved emission lifespan, as compared with the organic light-emitting device of Comparative Example 1.

Based on the above results, it is found that a polymer according to any of the embodiments may be effectively used to form a layer by a solution coating method, and may improve emission efficiency and emission lifespan of an organic light-emitting device.

As described above, a polymer according to any of the embodiments including a repeating unit which includes a polymerizable monomer having a specific condensed cyclic structure may be provided. The polymer may be used as a hole injection or hole transport material, and may have sufficient solubility compatible with solution treatment, improved thermal stability, and improved film uniformity. When the polymer according to an embodiment is used to form an organic layer of an organic light-emitting device, the organic light-emitting device may have improved device characteristics, including improved emission efficiency and improved emission lifespan. Accordingly, the polymer according to any of the embodiments may be used as an organic light-emitting device material capable of forming a laminated structure by solution coating.

A polymer according to any of the above-described embodiment may be synthesized by radical polymerization, more easily than an organic light-emitting material synthesized by condensation polymerization. The polymer according to any of the embodiments may be applicable to a variety of fields, not only to the field of organic light-emitting devices, and for example, may be used as a material of a charge transport layer.

As described above, according to the one or more embodiments, an organic light-emitting device including a polymer according to any of the above-described embodiments may have improved emission efficiency and improved emission lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. A polymer comprising a first repeating unit represented by Formula 1:

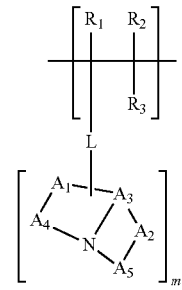

Formula 1 wherein, in Formula 1, $R_1$, $R_2$ and $R_3$ each independently are selected from a hydrogen, deuterium, a fluorine, a C1-C10 alkyl silyl group, a C6-C30 aryl silyl group, a substituted or unsubstituted C1-C10 alkyl group, a substituted or unsubstituted C6-C30 aryl group, and a substituted or unsubstituted C1-C30 heteroaryl group, L is selected from a single bond, a substituted or unsubstituted C1-C10 alkylene group, a substituted or unsubstituted C5-C30 cycloalkylene group, a substituted or unsubstituted C6-C30 arylene group, and a substituted or unsubstituted C1-C30 heteroarylene group, excluding a substituted or unsubstituted carbazolylene group, $A_1$ and $A_2$ each independently are selected from a single bond, an oxygen atom, a sulfur atom, a substituted or unsubstituted C1-C10 alkylene group, a substituted or unsubstituted C6-C30 arylene group, and a substituted or unsubstituted C1-C30 heteroarylene group, $A_3$ is selected from a substituted or unsubstituted trivalent C1-C10 alkyl group, a substituted or unsubstituted trivalent C6-C30 aryl group, and a substituted or unsubstituted trivalent C1-C30 heteroaryl group, $A_4$ and $A_5$ each independently are selected from a substituted or unsubstituted C1-C10 alkylene group, a substituted or unsubstituted C6-C30 arylene group, and a substituted or unsubstituted C1-C30 heteroarylene group, and m is an integer from 1 to 10.

2. The polymer of claim 1, wherein the first repeating unit represented by Formula 1 is a repeating unit represented by Formula 2:

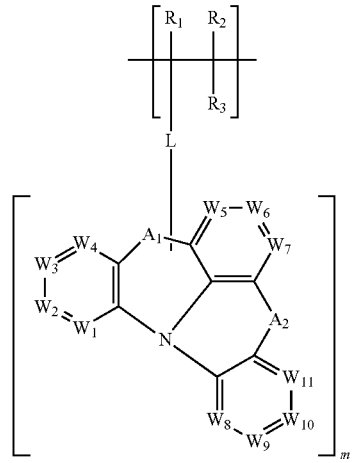

Formula 2 wherein, in Formula 2,

R$_1$, R$_2$, R$_3$, L, A$_1$, A$_2$ and m are the same as in claim 1, W$_1$ to W$_{11}$ each independently are N or CX, wherein X is selected from a hydrogen, deuterium, a C1-C10 alkyl silyl group, a C6-C30 aryl silyl group, a C1-C10 alkyl amino group, a C6-C60 aryl amino group, a substituted or unsubstituted C1-C10 alkyl group, a substituted or unsubstituted C6-C30 aryl group, and a substituted or unsubstituted C1-C30 heteroaryl group.

3. The polymer of claim 1, wherein the polymer further comprises a second unit represented by Formula 1, wherein the first repeating unit represented by Formula 1 and the second repeating unit represented by Formula 1 are different.

4. The polymer of claim 1, wherein L is selected from a single bond, a substituted or unsubstituted C6-C15 arylene group, and a substituted or unsubstituted C5-C15 heteroarylene group, excluding a substituted or unsubstituted carbazolylene group.

5. The polymer of claim 1, wherein L is selected from a single bond, a substituted or unsubstituted phenylene group, a substituted or unsubstituted naphthylene group, and a substituted or unsubstituted fluorenyl group.

6. The polymer of claim 1, wherein A$_1$ and A$_2$ are identical.

7. The polymer of claim 1, wherein A$_1$ and A$_2$ each independently are selected from a single bond, an oxygen atom, and a sulfur atom.

8. The polymer of claim 1, wherein W$_1$ to W$_{11}$ each independently are CX, wherein X is selected from a hydrogen, deuterium, a C1-C10 alkyl silyl group, a C6-C30 aryl silyl group, a C1-C10 alkyl amino group, a C6-C60 aryl amino group, a substituted or unsubstituted C1-C10 alkyl group, a substituted or unsubstituted C6-C30 aryl group, and a substituted or unsubstituted C1-C30 heteroaryl group.

9. The polymer of claim 2, wherein X is selected from a hydrogen, a substituted or unsubstituted C1-C10 alkyl group, a substituted or unsubstituted C6-C30 aryl amino group, and a substituted or unsubstituted C6-C15 aryl group.

10. The polymer of claim 2, wherein X is selected from a hydrogen, a substituted or unsubstituted C1-C10 alkyl group, a substituted or unsubstituted phenyl group, a substituted or unsubstituted biphenylyl group, a substituted or unsubstituted terphenyl group; a substituted or unsubstituted fluorenyl group, a substituted or unsubstituted spirobifluorenyl group, a substituted or unsubstituted C6-C30 diaryl amino group, and a substituted or unsubstituted C6-C30 triaryl amino group.

11. The polymer of claim 1, wherein m is 1, 2 or 3.

12. The polymer of claim 1, further comprising a cross-linking group.

13. The polymer of claim 12, wherein the cross-linking group is selected from structures represented by the following formulae:

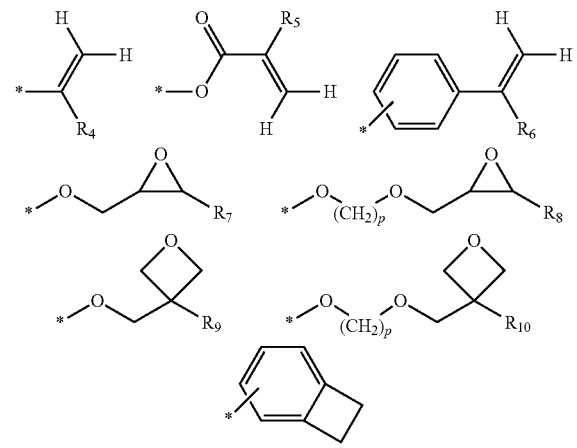

wherein, in the above formulae,

R$_4$ to R$_{10}$ each independently are a hydrogen, or a substituted or unsubstituted C1-C10 alkyl group, and p is an integer from 1 to 10.

14. The polymer of claim 1, wherein the polymer has a number average molecular weight of about 10,000 to about 100,000 Daltons.

15. The polymer of claim 1, wherein the polymer has a polydispersity index of about 1.5 to about 2.5.

16. An organic light-emitting device comprising:
a first electrode;
a second electrode; and
an organic layer disposed between the first electrode and the second electrode,
wherein the organic layer comprises the polymer of claim 1.

17. The organic light-emitting device of claim 16, wherein the organic layer comprises at least one layer, and wherein the at least one layer is a hole transport layer comprising the polymer.

18. The organic light-emitting device of claim 16, wherein the organic layer comprises at least one layer that is an emission layer comprising a light-emitting material which provides emission from triplet excitons.

19. An organic light-emitting device material comprising the polymer of claim 1.

20. The organic light-emitting device material of claim 19, further comprising a solvent.

* * * * *